United States Patent
Yuan

(10) Patent No.: US 10,861,955 B2
(45) Date of Patent: Dec. 8, 2020

(54) FABRICATION METHODS OF INSULATED GATE BIPOLAR TRANSISTORS

(71) Applicants: Semiconductor Manufacturing International (Shanghai) Corporation, Shanghai (CN); Semiconductor Manufacturing International (Beijing) Corporation, Beijing (CN)

(72) Inventor: Lei Bing Yuan, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/680,653

(22) Filed: Nov. 12, 2019

(65) Prior Publication Data
US 2020/0083348 A1 Mar. 12, 2020

Related U.S. Application Data

(62) Division of application No. 15/882,354, filed on Jan. 29, 2018, now Pat. No. 10,505,012.

(30) Foreign Application Priority Data

Feb. 10, 2017 (CN) .......................... 2017 1 0073772

(51) Int. Cl.
*H01L 29/66* (2006.01)
*H02M 7/219* (2006.01)
(Continued)

(52) U.S. Cl.
CPC ...... *H01L 29/66325* (2013.01); *H01L 29/407* (2013.01); *H01L 29/66348* (2013.01);
(Continued)

(58) Field of Classification Search
CPC . H01L 51/56; H01L 51/5253; H01L 51/5056; H01L 51/0072; H01L 27/3244
(Continued)

(56) References Cited

U.S. PATENT DOCUMENTS

2009/0283797 A1* 11/2009 Takahashi ........... H01L 29/7397
257/139
2017/0025408 A1* 1/2017 Schulze .............. H01L 27/0664
(Continued)

FOREIGN PATENT DOCUMENTS

CN 104916672 A 9/2015

*Primary Examiner* — Andy Huynh
(74) *Attorney, Agent, or Firm* — Anova Law Group, PLLC

(57) ABSTRACT

Method for fabricating an insulated gate bipolar transistor (IGBT) is provided. A substrate includes a device region, that includes control regions and turn-off regions, arranged alternately. A drift region is formed in the substrate. A well region is formed in a portion of the substrate in the control regions and the turn-off regions, and first gate structures are formed in the control regions. The well region is in contact with the drift region, and the first gate structures are in contact with both the drift region and the well region. Emission regions are formed in the well region of the control regions and in the substrate on one or both sides of each first gate structure, the drift region and each emission region are separated by the well region, and the emission regions are electrically connected to a portion of the well region in the turn-off region.

20 Claims, 5 Drawing Sheets

(51) Int. Cl.
   *H01L 29/739* (2006.01)
   *H01L 29/40* (2006.01)
   *H01L 29/06* (2006.01)

(52) U.S. Cl.
   CPC ...... *H01L 29/7393* (2013.01); *H01L 29/7397* (2013.01); *H02M 7/219* (2013.01); *H01L 29/0619* (2013.01); *H01L 29/0696* (2013.01)

(58) Field of Classification Search
   USPC ..................................................... 257/122
   See application file for complete search history.

(56) References Cited

U.S. PATENT DOCUMENTS

| 2017/0084611 A1* | 3/2017 | Iwasaki ............... H01L 29/7397 |
| 2017/0148785 A1 | 5/2017 | Hirabayashi |
| 2017/0271323 A1 | 9/2017 | Sugawara et al. |

* cited by examiner

FABRICATION METHODS OF INSULATED GATE BIPOLAR TRANSISTORS

CROSS-REFERENCES TO RELATED APPLICATIONS

This application is a divisional of U.S. patent application Ser. No. 15/882,354, filed on Jan. 29, 2018, which claims the priority of Chinese Patent Application No. CN201710073772.1, filed on Feb. 10, 2017, the entire content of all of which is incorporated herein by reference.

FIELD OF THE DISCLOSURE

The present disclosure generally relates to the field of semiconductor fabrication technology and, more particularly, relates to fabrication methods of insulated gate bipolar transistors.

BACKGROUND

With the continuous increase of the integration degree of semiconductor devices on a chip, the critical dimensions of the transistors are steadily reduced. The reduction of critical dimensions means that more transistors can be arranged on the chip. However, the rapid decrease in the dimension of the transistors challenges performance of the transistors.

Among switch-mode power-supply devices with an intermediate/high power, insulated gate bipolar transistor (IGBT) has been increasingly applied to the modern electric and electronic technology because of the characteristics that IGBT demonstrates, such as simple control/driving circuit, high operation frequency, large capacity, etc.

An IGBT is a composite device combining a metal-oxide-semiconductor field-effect transistor (MOSFET) and a bipolar transistor. Specifically, the input terminal of an IGBT is associated with a MOSFET, and the output terminal is associated with a PNP transistor. Therefore, the IGBT may be regarded as a Darlington tube with a MOS input. Accordingly, the IGBT may have the advantages of both transistors. That is, the IGBT may not only demonstrate advanced features of the MOSFET device such as high input impedance, simple and rapid driving characteristics, etc., but also demonstrates advanced features of bipolar transistors such as low conduction voltage drop, large capacity, etc.

However, the IGBTs formed by existing fabrication methods often face problems such as long turn-off trailing time, high turn-off energy consumption, etc. The disclosed IGBTs and fabrication methods are directed to solve one or more problems set forth above and other problems in the art.

BRIEF SUMMARY OF THE DISCLOSURE

One aspect of the present disclosure includes an insulated gate bipolar transistor (IGBT). The IGBT includes a substrate, including a device region and a collection region. The device region and the collection region are arranged into a bilayer structure along a direction perpendicular to a surface of the substrate. The device region includes a plurality of control regions and a plurality of turn-off regions, arranged alternately along a direction parallel to the surface of the substrate. The IGBT also includes a drift region formed in the substrate of the control regions and the turn-off regions, and electrically connected to the collection region; a well region formed in the substrate of the control regions and the turn-off regions, and in contact with the drift region; a plurality of first gate structures formed in the control regions, and in contact with the drift region and the well region; and a plurality of emission regions formed in the well region of the control regions. The plurality of emission regions are formed in the substrate on at least one side of each first gate structure. Moreover, the plurality of emission regions are isolated from the drift region by the well region, and are electrically connected to the well region of the turn-off regions.

Another aspect of the present disclosure provides a method for fabricating an IGBT. The fabrication method includes providing a substrate including a device region. The device region includes a plurality of control regions and a plurality of turn-off regions, arranged alternately along a direction parallel to a surface of the substrate. The plurality of control regions and the plurality of turn-off regions include a drift region. The method also includes forming a well region in a portion of the substrate in the control regions and the turn-off regions, and a plurality of first gate structures in the control regions. The well region is in contact with the drift region, and the plurality of first gate structures are in contact with both the drift region and the well region. The method further includes forming a plurality of emission regions in the well region of the control regions, and forming a collection region in the substrate. The emission regions are formed in the substrate on one side or both sides of each first gate structure, the drift region and each emission region are separated by the well region, and the emission regions are electrically connected to a portion of the well region in the turn-off region. The collection region and the device region are arranged into a bilayer structure along a direction perpendicular to the surface of the substrate, and the collection region is in contact with the drift region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The present disclosure provides technical solutions to the problems, such as long turn-off trailing time, high turn-off energy consumption, etc., in conventional insulated gate bipolar transistors (IGBTs) and their fabrication methods.

Figure 1:
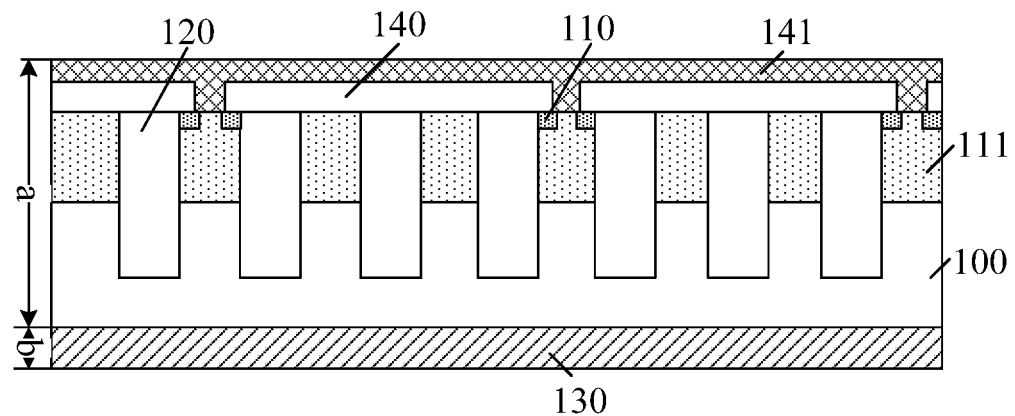
FIG. 1 illustrates a schematic cross-section view of an insulated gate bipolar transistor IGBT.

FIG. 1 illustrates a schematic cross-section view of an IGBT. Referring to FIG. 1, the IGBT includes a substrate (not shown). The substrate includes a first region a and a second region b. The first region a and the second region b are arranged into a bilayer structure with the first region a on the top of the second region b along the direction perpendicular to the surface of the substrate. The IGBT also includes a well region 111 and a drift region 100 in the first region a. The drift region 100 and the well region 111 are arranged into a bilayer structure along the direction perpendicular to the surface of the substrate. The drift region 100 is arranged between the well region 111 and the second region b. The IGBT also includes a plurality of gate structures 120 formed in the drift region 100 and penetrating through the well region 111 along the direction perpendicular to the surface of the substrate, a plurality of emission regions 110 formed in the well region 111 on one side or on both sides of each gate structure 120, an electrical connection structure 141 connected with the plurality of emission regions 110, and a collection region 130 formed in the substrate of the second region b.

The IGBT is formed by combining a MOSFET together with a bipolar transistor.

Specifically, the emitter of the bipolar transistor is the MOSFET, while the collection region 130 and the drift region 100 are the collector and the base of the bipolar transistor, respectively. Each MOSFET includes a gate structure 120, a well region 111, and an emission region 110. The gate structure 120 controls the channel of the MOSFET to be on or off.

When turning the IGBT into an on-state, the channel of the MOSFET is turned on. In the meantime, the collector region 130 injects holes into the drift region 100 such that the IGBT is turned on. Because the electrical conduction in an IGBT may be carried by both types of carriers, i.e. electrons and holes. Therefore, the IGBT may demonstrate advantages such as low conduction voltage drop, large current, etc. Moreover, by controlling the switch between the on-state and the off-state of the IGBT through the gate voltage, the IGBT may also demonstrate advantages of high input impedance and low driving power.

When turning the IGBT into an off-state, holes in the drift region 100 are pulled out by controlling the voltage applied on the gate structure 120. Therefore, the channel of the MOSFET is turned off. In the meantime, the number of holes injected into the draft region 100 from the collection region 130 is reduced such that the IGBT is turned off. Therefore, the energy consumption of a turn-off action is determined by the ability of the gate structure in pulling out holes and the reduction rate of holes injected into the drift region 100. However, the existing IGBTs face the problems of long turn-off trailing time and high turn-off energy consumption.

In order to reduce the turn-off energy consumption, a method is to perform an electronic irradiation process on the collection region 130 of the substrate, such that the defect level in the collection region 130 may increase. Accordingly, the concentration of holes in the collection region 130 may be reduced, which may be able to further reduce the concentration of the holes injected into the drift region 100 from the collection region. As such, the turn-off trailing time may be reduced and the turn-off energy consumption may also be reduced. However, when electronic irradiation is performed on the collection region 130 of the substrate in order to increase the defect level in the collection region 130, the leakage current may also be easily increased.

Another method to reduce the turn-off energy consumption is to reduce the hole concentration in a portion of the collection region 130 such that the number of the holes injected into the drift region 100 from the collection region 130 may be reduced. Thus, the turn-off energy consumption may be reduced. However, according to this method, during the process to form the collection region 130, a photomask may be used and ions may be implanted into the substrate of the second region b using the photomask as a mask. However, the fabrication process for the photomask is complicated and the product cost is also high, which lead to a relatively challenging fabrication process for the IGBT.

Figure 12:
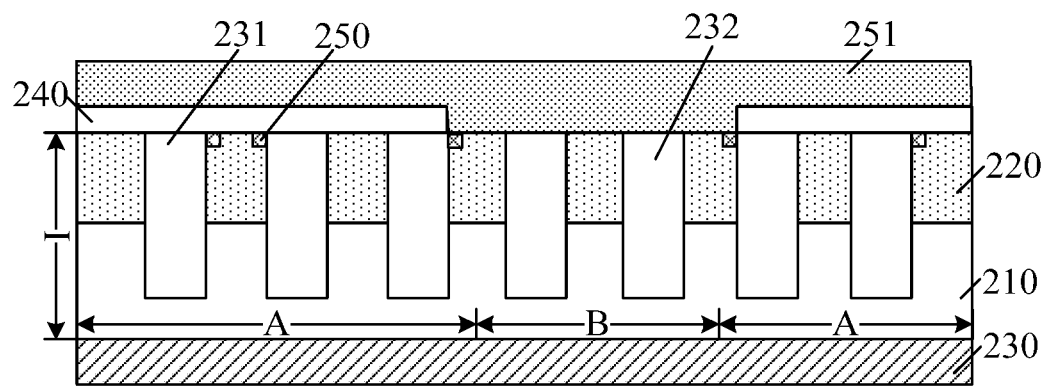
Figure 13:
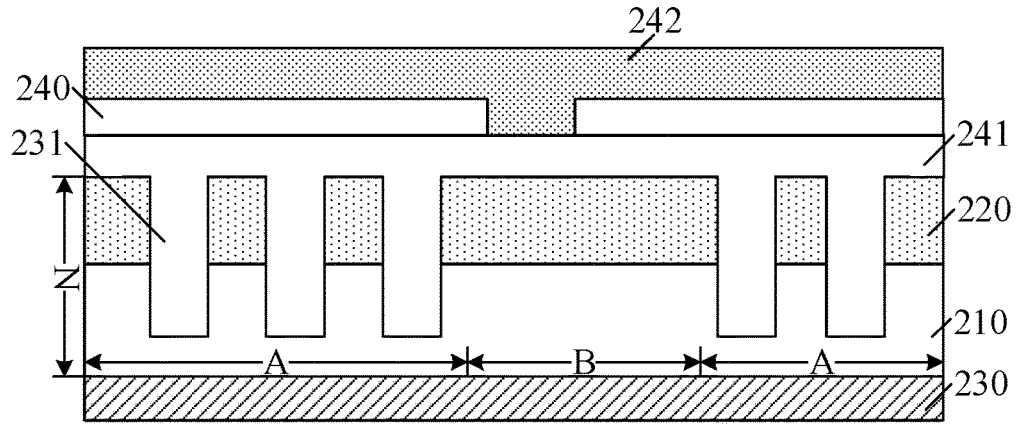
Figure 14:
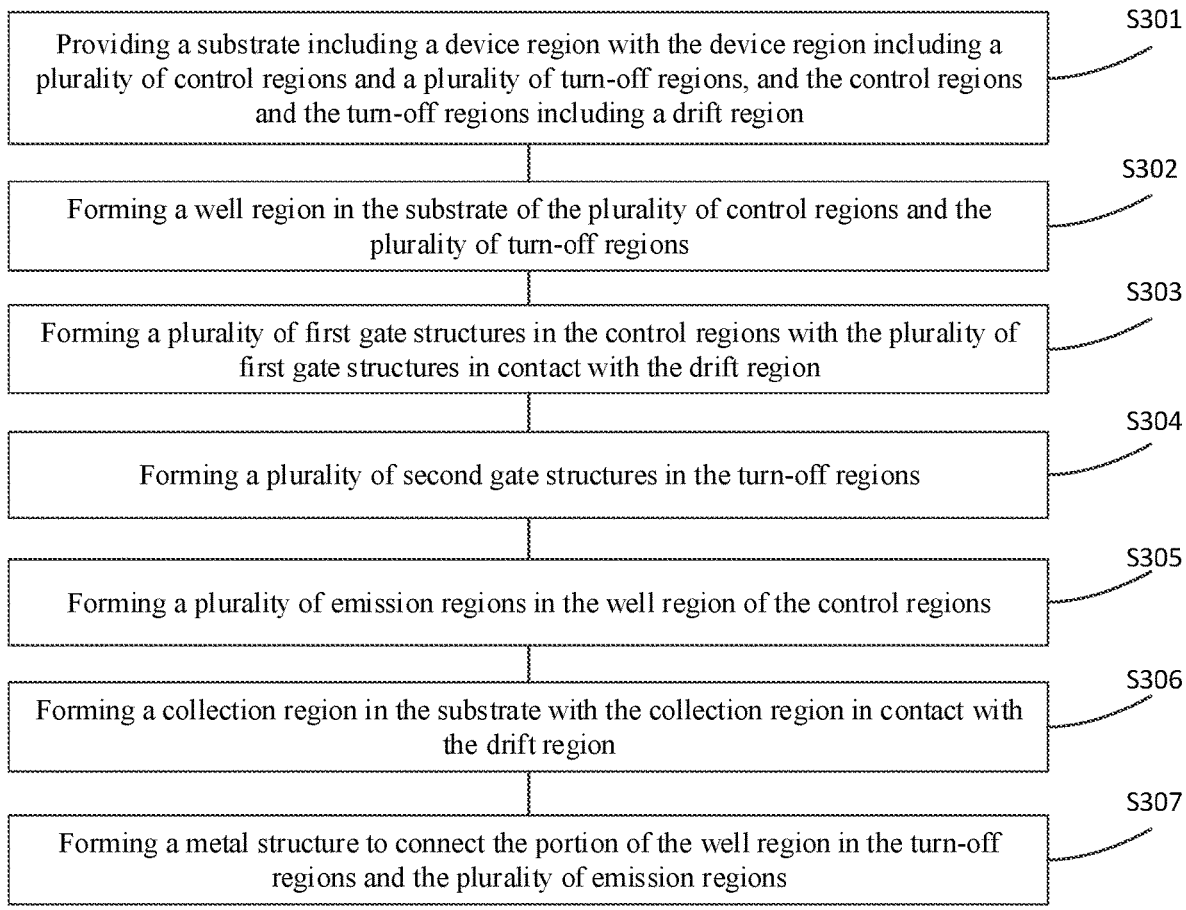
FIG. 14 illustrates a flowchart of an exemplary method for fabricating a semiconductor structure consistent with various disclosed embodiments in the present disclosure.

The present disclosure provides an IGBT and a method for fabricating an IGBT. FIG. 14 illustrates a flowchart of an exemplary method for fabricating an IGBT consistent with various disclosed embodiments in the present disclosure. FIGS. 2-13 illustrate schematic views of semiconductor structures at certain stages of an exemplary fabrication process for the IGBT consistent with various disclosed embodiments in the present disclosure.

Figure 2:
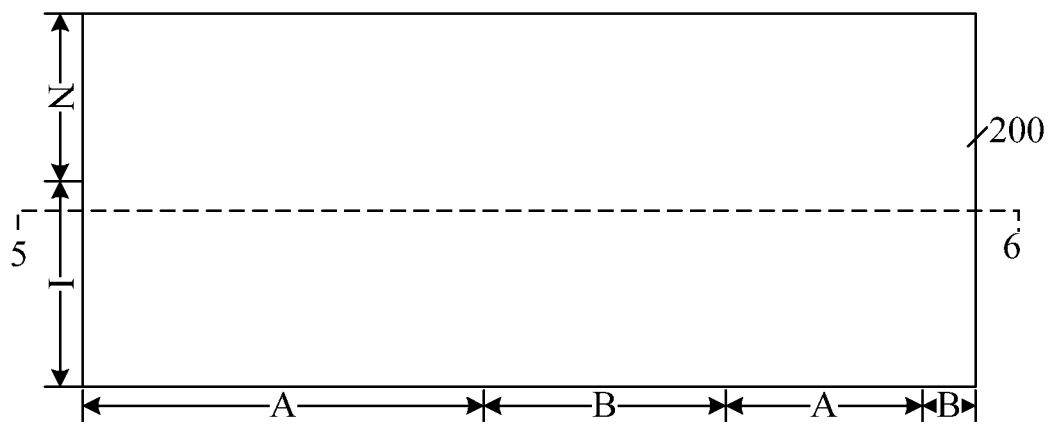
FIGS. 2-13 illustrate schematic views of semiconductor structures at certain stages of an exemplary fabrication process for an IGBT consistent with various disclosed embodiments in the present disclosure.
Figure 3:
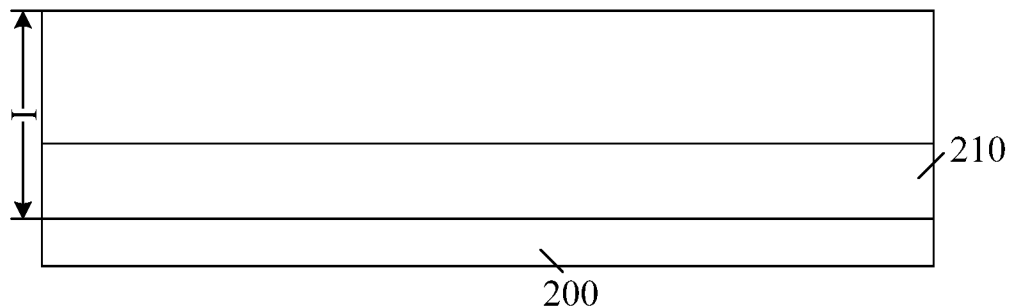

Referring to FIG. 14, at the beginning of the fabrication process, a substrate including a device region may be provided with the device region including a plurality of control regions and a plurality of turn-off regions, and the control regions and the turn-off regions including a drift region (S301). FIG. 2 illustrates a schematic top view of a corresponding semiconductor structure. FIG. 3 illustrates a schematic cross-section view of the semiconductor structure shown in FIG. 2 along line "5-6".

Referring to FIG. 2 and FIG. 3, a substrate 200 may be provided. The substrate 200 may include a device region I. The device region I may include a plurality of control regions A and a plurality of turn-off regions B. The control regions A and the turn-off regions B may be arranged alternately along a direction parallel to the surface of the substrate 200. In the control regions A and the turn-off regions B, the substrate 200 may include a drift region 210.

The drift region 210 in the device region I may be used to form a well region and a plurality of emission regions in a subsequent process. The turn-off regions B may be used to reduce the turn-off energy consumption and reduce the turn-off trailing time.

In one embodiment, the substrate 200 may also include a connection region N.

The connection region N and the device region I may be arranged side by side along a direction parallel to the surface of the substrate 200.

After forming a plurality of first gate structures in a subsequent process, the connection region may be used to further form a gate electrode connection structure to electrically connect the plurality of first gate structures.

In one embodiment, the substrate 200 may be a planar substrate. For example, the substrate 200 may be made of silicon. In another embodiment, the substrate may also be made of germanium, SiGe, or any other appropriate semiconductor material.

In one embodiment, the substrate 200 may be doped with first doping ions. The first doping ions may be N-type ions, such as P ions, As ions, etc.

A portion of the substrate 200 may be used as the drift region 210 for the subsequently-formed IGBT. Therefore, the drift region 210 may contain the first doping ions.

In subsequent processes, a well region and a plurality of first gate structures may be formed. The well region may be formed in the substrate in both the control regions A and the turn-off regions B. The well region may be in contact with the drift region 210. The plurality of first gate structures may be formed in the control regions A. The first gate structures may be in contact with both the drift region 210 and the well region.

Figure 4:
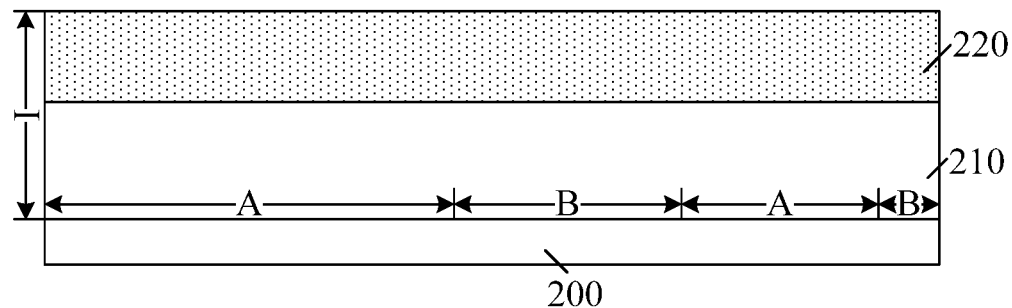

Returning to FIG. 14, a well region may be formed in the substrate of the control regions and the turn-off regions (S302). FIG. 4 illustrates a schematic cross-section view of a corresponding semiconductor structure processed from the semiconductor structure shown in FIG. 3.

Referring to FIG. 4, a well region 220 may be formed in the substrate 200 of the control regions A as well as the turn-off regions B. In one embodiment, the well region 220 and the drift region 210 may be arranged into a bilayer structure along the direction perpendicular to the surface of the substrate 200.

In one embodiment, the well region 220 may be formed by performing an ion implantation process on the substrate of both the control regions A and the turn-off regions B. For example, by implanting second doping ions into the substrate 200 of the control regions A and the turn-off regions B, the well region 220 may be formed.

In one embodiment, the second doping ions implanted into the well region 220 may be P-type ions, such as P ions, $BF^{2-}$ ions, etc.

When the concentration of the second doping ions in the well region 220 is too high, the turning-on voltage of the subsequently-formed IGBT may be easily increased, and thus the turning-on energy consumption may be increased. Therefore, the concentration of the second doping ions in the well region may be relatively low. For example, in one embodiment, the concentration of the second doping ions in the well region 220 may be in a range of approximately 9E16 atoms/cm$^{-3}$ to 1.1E17 atoms/cm$^{-3}$.

Figure 5:
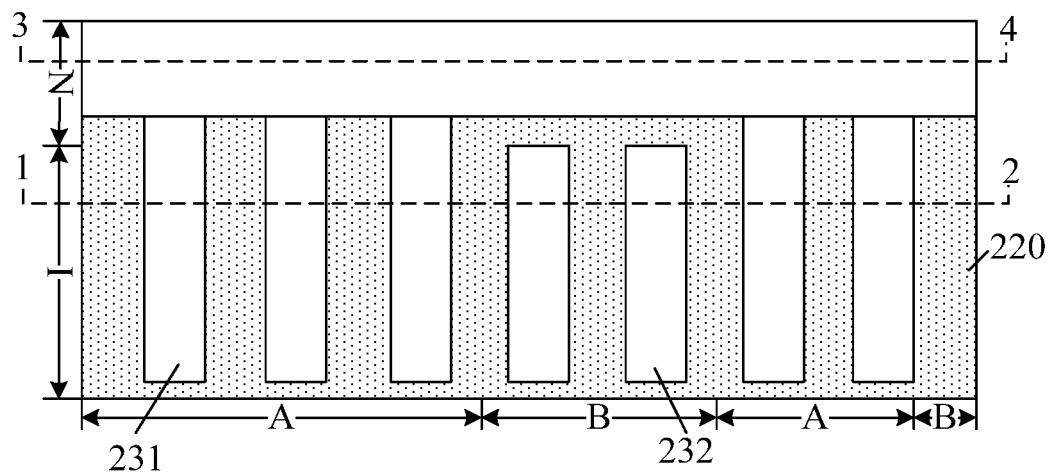
Figure 6:
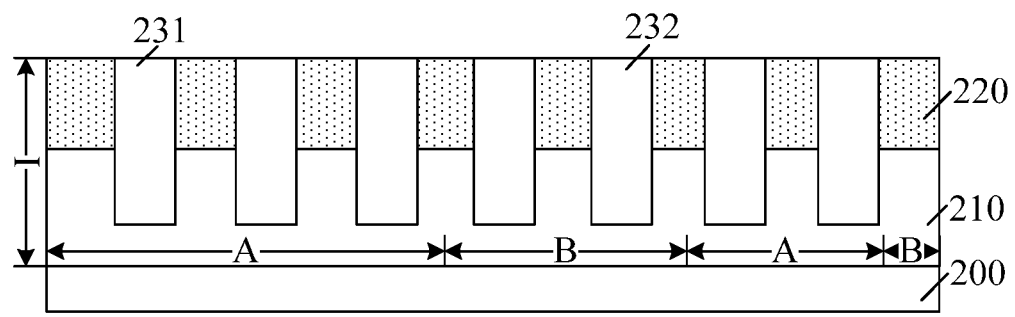

Returning to FIG. 14, a plurality of first gate structures may be formed in the control regions with the plurality of first gate structures in contact with the drift region (S303). FIG. 5 shows a schematic top view of a corresponding semiconductor structure processed from the semiconductor structure shown in FIG. 2. FIG. 6 illustrates a schematic cross-section view of the semiconductor structure shown in FIG. 5 along line "1-2", and FIG. 7 illustrates a schematic cross-section view of the semiconductor structure shown in FIG. 5 along line "3-4".

Figure 7:
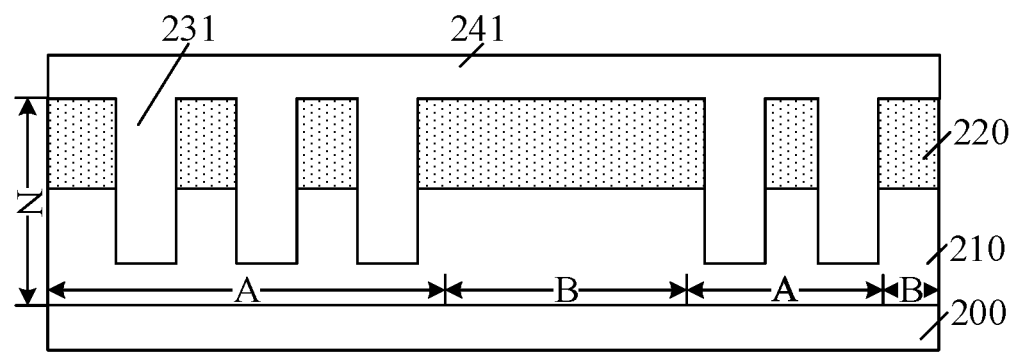

Referring to FIGS. 5-7, a plurality of first gate structures 231 may be formed in the control regions A. The plurality of first gate structures 231 may be in contract with the drift region 210. The first gate structures 231 may be used to control the subsequently formed IGBT to be on or off.

In one embodiment, the plurality of first gate structures 231 may be formed in both the well region 220 and the drift region 210 of the plurality of control regions A. Moreover, each first gate structure 231 may penetrate through the well region 220 and may be in contact with the drift region 210. That is, each first gate structure 231 may extend into the drift region 210. In other embodiments, the plurality of first gate structures may be formed on the surface of the drift region in the plurality of control regions, and the well region may be formed in the drift region on both sides of each first gate structure.

In one embodiment, forming the first gate structures 231 in the well region 220 and the drift region 210 may allow the channels to be formed on the sidewall surfaces of the first gate structures 231 such that the length direction of the channels may be perpendicular to the surface of the substrate 200. As such, the degree of integration of the formed IGBT may be improved, and the ability of the first gate structures 231 to control the carriers may also be improved.

In one embodiment, each first gate structure 231 extends into the substrate 200 of the connection region N.

Further, referring to FIG. 14, a plurality of second gate structures may be formed in the turn-off regions (S304).

Returning to FIG. 5 and FIG. 6, the fabrication process for the IGBT may also include forming a plurality of second gate structures 232 in the turn-off regions B. The second gate structures 232 may be used to electrically connect a plurality of emission regions formed in a subsequent process.

The plurality of second gate structures 232 may be formed in the turn-off regions B to provide electrical connections for the subsequently-formed emission regions. Further, because each emission region is configured to connect a low voltage level, the corresponding second gate structure 232 may also be connected to the low voltage level. Moreover, during the process to turn off the IGBT, the second gate structures 232 may be able to pull out the holes in the drift region 210. As such, the turn-off speed for the formed IGBT may be improved, and the turn-off energy consumption of the IGBT may also be reduced.

In one embodiment, the second gate structures 232 may be formed in the well region 220 and the drift region 210 in the plurality of turn-off regions B. The second gate structures 232 may penetrate through the well region 220 and may be in contact with the drift region 210. In another embodiment, the second gate structures may also be formed on the surface of the drift region in the turn-off regions, and the well region in the drift region may be formed on both sides of each second gate structure.

By forming the second gate structure 232 in the well region 220 and the drift region 210, the contact areas between the second gate structure 232 and the well region 220, and between the second gate structure 232 and the drift region 210 may be increased. As such, the ability of the second gate structure 232 to pull out the holes may be improved, and thus the turn-off energy consumption may be reduced.

In one embodiment, the plurality of second gate structures 232 are only formed in the device region I.

The process to form the plurality of first gate structures 231 and the plurality of second gate structures 232 may include the following steps. First, the well region 220 and the drift region 210 may be etched to form a plurality of first trenches in the well region 220 and the drift region 210 of the control regions A and also in the substrate 200 of the connection region N. In addition, after etching, a plurality of second trenches may also be formed in the well region 220 and the drift region 210 of the turn-off regions B. Further, a first gate structure 231 may be formed in each first trench and a second gate structure 232 may be formed in each second trench.

In one embodiment, forming a first gate structure 231 in each first trench and a second gate structure 232 in each second trench further includes the following steps. First, a gate structure layer may be formed in each first trench and each second trench, and also on the well region 220 of the device region I as well as the substrate 200 of the connection region N. Further, the portion of the gate structure layer formed on the well region 220 of the device region I may be removed.

In one embodiment, during the fabrication process for the plurality of first gate structures 231 and the plurality of second gate structures 232, the portion of the gate structure layer formed on the portion of the substrate 200 in the connection region N may be kept to form a plurality of gate electrode lines 241 (referring to FIG. 7) for the first gate structures 231.

In one embodiment, each of the first gate structures 231 and the second gate structures 232 may further include a gate electrode and a gate dielectric layer formed between the gate electrode and the well region 220 and also between the gate electrode and the drift region 210.

For example, the gate dielectric layer may be formed on the bottom surfaces of the first trenches and the second trenches. The corresponding gate electrode may be formed on the surface of the gate dielectric layer.

In one embodiment, the gate dielectric layer may be made of $SiO_x$. The gate electrode may be made of polycrystalline silicon. In another embodiment, the gate dielectric layer may be made of any other appropriate dielectric material and the gate electrode may be made of polycrystalline germanium.

Figure 8:
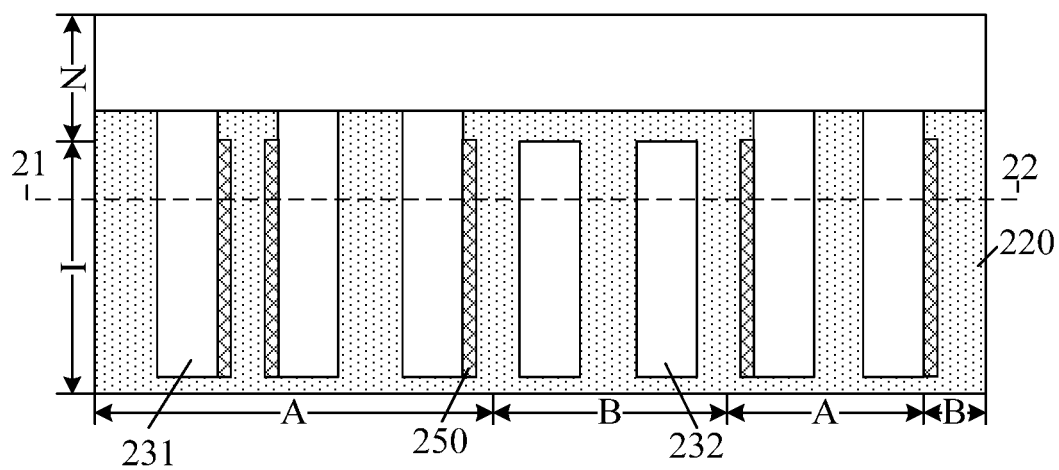
Figure 9:
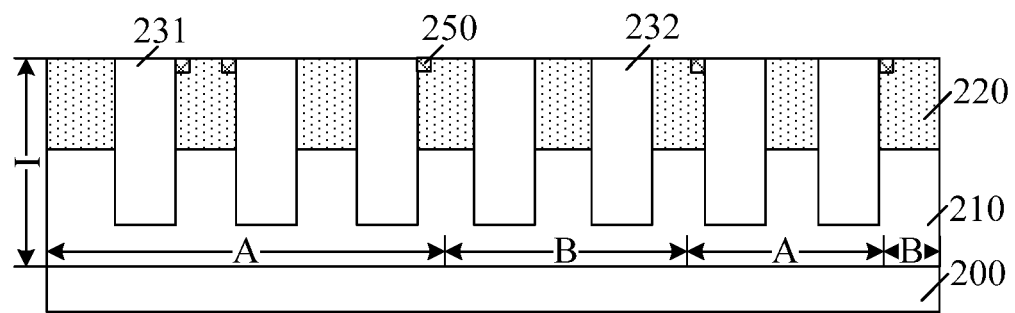

Returning to FIG. 14, a plurality of emission regions may be formed in the well region of the control regions (S305). FIGS. 8 and 9 illustrate schematic views of a corresponding semiconductor structure. Specifically, FIG. 8 shows a schematic top view of a corresponding semiconductor structure processed from the semiconductor structure shown in FIG. 5. FIG. 9 illustrates a schematic view of the semiconductor structure shown in FIG. 8 along line "21-22".

Referring to FIGS. 8 and 9, a plurality of emission regions 250 may be formed in the well region 220 of the control regions A. Specifically, the emission regions 250 may be formed in the substrate 200 on one side or on both sides of each first gate structure 231. The drift region 210 may be isolated from the plurality of emission regions 250 by the well region 220. The plurality of emission regions 250 may be electrically connected to the portion of the well region 220 in the turn-off regions B.

In one embodiment, because the plurality of emission regions 250 are electrically connected to the portion of the well region 250 in the turn-off regions B, when the emission regions 250 are used to connect a low voltage level, the portion of the well region 220 in the turn-off regions B may also be connected to the low voltage level. During the process to turn off the IGBT, the portion of the well region 220 in the turn-off regions B may pull out holes from the drift region 210 such that the turn-off speed of the formed IGBT may be enhanced and the turn-off energy consumption may be reduced.

The process to form the plurality of emission regions 250 may include implanting second doping ions into the portion of the well region 220 on one side or on both sides of each first gate structure 231 using the plurality of first gate structures 231 as a mask.

In one embodiment, the plurality of emission regions 250 may only be formed in the control regions A. Moreover, the second doping ions may be N-type ions, such as phosphor ions and arsenic ions.

Figure 10:
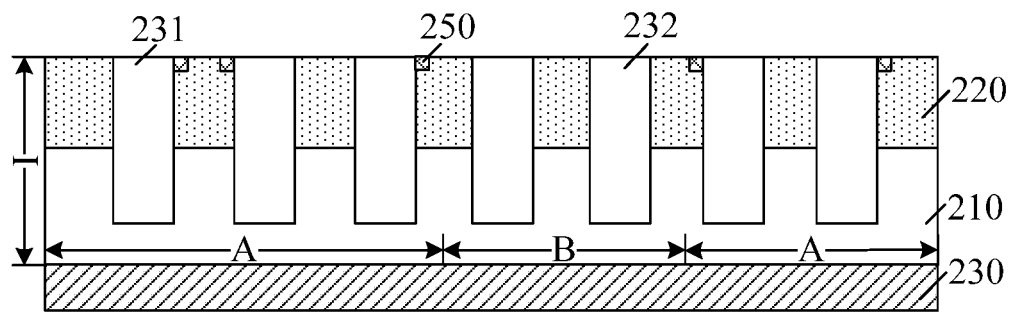
Figure 11:
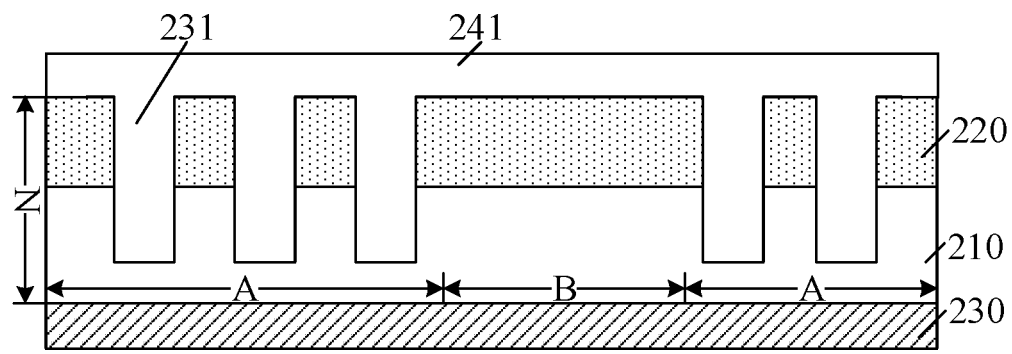

Further, returning to FIG. 14, a collection region in contact with the drift region may be formed in the substrate (S306). FIGS. 10 and 11 illustrate schematic cross-section views of a corresponding semiconductor structure. Specifically, FIG. 10 shows a schematic cross-section view of a corresponding semiconductor structure processed from the semiconductor structure shown in FIG. 9, and FIG. 11 shows a schematic cross-section view of a corresponding semiconductor structure processed from the semiconductor structure shown in FIG. 7.

Referring to FIGS. 10 and 11, a collection region 230 may be formed in the substrate 200 (referring to FIG. 9). The device region I and the collection region 230 may be arranged into a bilayer structure along the direction perpendicular to the surface of the substrate 200. The collection region 230 may be in contact with the drift region 210.

The collection region 230 may be formed by implanting first doping ions into the substrate 200 from the side opposite to the well region 220. In one embodiment, the first doping ions implanted into the collection region 230 may be P-type ions, such as boron ions and $BF_2"$ ions. Moreover, the drift region 210 may be located between the well region 220 and the collection region 230.

Further, returning to FIG. 14, a metal structure may be formed to connect the portion of the well region in the turn-off regions and the plurality of emission regions (S307). FIGS. 12 and 13 illustrate schematic cross-section views of a corresponding semiconductor structure. Specifically, FIG. 12 shows a schematic cross-section view of a corresponding semiconductor structure processed from the semiconductor structure shown in FIG. 10, and FIG. 13 shows a schematic cross-section view of a corresponding semiconductor structure processed from the semiconductor structure shown in FIG. 11.

Referring to FIGS. 12 and 13, a metal structure 251 may be formed to connect the portion of the well region 220 in the turn-off regions B and the plurality of emission regions 250.

The metal structure 251 may electrically connect the portion of the well region 220 in the turn-off regions B to the plurality of emission regions 250. Therefore, when the plurality of emission regions 250 are connected to a low voltage level, the portion of the well region 220 in the turn-off regions B may also be connected to the low voltage level. As such, the turn-off trailing time of the formed IGBT may be reduced and the turn-off energy consumption may also be reduced.

In one embodiment, the portion of the well region 220 in the turn-off regions B is connected with the metal structure 251 and the concentration of the first doping ions in the well region 220 is relatively low. Therefore, Schottky barrier may be formed at the contact interface between the metal structure 251 and the portion of the well region 220 in the turn-off regions B. When the first doping ions in the well region 220 are P-type ions, during the turn-off process of the IGBT, the metal structure 251 may be connected to a low voltage level, and thus the electrons in the metal structure 251 may be easily transferred into the well region 220 and further recombine with the holes in the drift region 210. As such, the turn-off speed of the formed IGBT may be enhanced and the turn-off energy consumption may be reduced.

In one embodiment, the metal structure 251 may also be connected to the plurality of second gate structures 232, and thus the plurality of second gate structures may be electrically connected to the plurality of emission regions 250. As such, the second gate structures 232 may be able to pull out holes from the drift region 210, and thus reduce the turn-off trailing time.

In one embodiment, the process to form the metal structure 251 may include the following steps. First, a dielectric layer covering the plurality of first gate structures 231 may be formed. The dielectric layer 240 may expose the portion of the well region 220 in the turn-off regions B and also expose the plurality of emission regions 250. Further, the metal structure 251 may be formed on the surface of the portion of the well region 220 in the turn-off regions B and also on the surface of the emission regions 250 in the turn-off regions B. In addition, the metal structure 251 may also be formed on the dielectric layer 240 in the plurality of control regions A.

In one embodiment, the dielectric layer 240 may expose the plurality of second gate structures, and accordingly, the metal structure may also be formed on the surfaces of the second gate structures 232.

In one embodiment, the metal structure 251 is made of copper. In another embodiment, the metal structure may also be made of aluminum.

In one embodiment, the fabrication method may also include forming a gate electrode metal structure 242 to connect the plurality of gate electrode lines 241. The gate electrode metal structure 242 together with the gate electrode lines 241 may form a gate electrode connection structure.

In one embodiment, the dielectric layer 240 may also cover the gate electrode lines 241. In addition, a plurality of openings may also be formed in the portion of the dielectric layer 240 in the connection region N with the bottom of each opening exposing a portion of the corresponding gate electrode line 241. The process to form the gate electrode metal structure 242 may include forming the gate electrode metal structure 242 in the openings and also on the portion of the dielectric layer 240 in the connection region N. The gate electrode metal structure 242 may not be in contact with the metal structure 251.

In one embodiment, the metal structure 251 and the gate electrode metal structure 242 may be made of copper. In another embodiment, the metal structure and the gate electrode metal structure may also be made of aluminum.

Therefore, according to the disclosed fabrication method for an IGBT, the emission regions may be used to connect a low voltage level, and the emission region may be electrically connected to the portion of the well region formed in the turn-off regions. Therefore, the portion of the well region may also be connected to the low voltage level. During the process to turn off the formed IGBT, the portion of the well region in the turn-off regions may be able to pull out holes from the drift region such that the turn-off speed of the formed IGBT may be enhanced and the turn-off energy consumption may be reduced.

Further, a plurality of second gate structures may be formed in the turn-off regions of the substrate. The plurality of second gate structures may be electrically connected to a plurality of emission regions. Because the plurality of emission regions may be used to connect a low voltage level, the plurality of second gate structures may also be connected to the low voltage level. During the process to turn off the IGBT, the plurality of second gate structures may be able to pull out the holes from the drift region such that the turn-off speed of the IGBT may be enhanced and the turn-off energy consumption of the IGBT may be reduced.

The present disclosure also provides an IGBT. FIGS. 12 and 13 illustrate two schematic cross-section views of an exemplary IGBT consistent with various embodiments of the present disclosure.

Referring to FIGS. 12 and 13, the IGBT may include a substrate. The substrate may further include a device region I and a collection region 230. The device region I and the collection region 230 may be arranged into a bilayer structure along the direction perpendicular to the surface of the substrate. The bilayer structure may be a stacked structure, for example, having the device region I stacked over the collection region 230. The device region I may include a plurality of control regions A and a plurality of turn-off regions B. The plurality of control regions A and the plurality of turn-off regions B may be arranged alternately along a direction parallel to the surface of the substrate. The IGBT may also include a well region 220 formed in the portion of the substrate of the control regions A and the turn-off regions B, and a drift region 210 also formed in the substrate of the control regions A and the turn-off regions B. The drift region 210 may be in contact with the collection region 230. The IGBT may further include a plurality of first gate structures formed in the control regions A and in contact with the drift region 210, and a plurality of emission regions 250 formed in the portion of the substrate of the control regions A and in contact with the plurality of first gate structures 231. The drift region 210 may be isolated from the plurality of emission regions 250 by the well region 220. Moreover, the plurality of emission regions 250 may be electrically connected to the well region 220 of the turn-off regions B.

In one embodiment, the IGBT may also include a metal structure 251. The metal structure 251 may connect the plurality of emission regions 250 to the well region of the turn-off regions B.

The IGBT may also include a dielectric layer 240 formed on the plurality of first gate structures 231 in the control regions A. The dielectric layer 240 may expose the well region 220 of the turn-off regions B and also expose the plurality of emission regions 250. The metal structure 251 may also be formed on the surfaces of the well region 220 and the emission regions 250 in the turn-off regions B and also on the dielectric layer 240 in the control regions A.

The substrate of the IGBT may also include a connection region. The connection region and the device region I may be arranged along the length direction of the each of the first gate structures 231. Moreover, each of the first gate structures 231 may extend to the connection region.

The IGBT may also include a gate electrode connection structure that is electrically connected to the plurality of first gate structures 231 formed in the connection region.

In one embodiment, the gate electrode connection structure may include a gate electrode line 241 used to connect the plurality of first gate structures 231 in the connection region, and a gate electrode metal structure 242 used to connect the gate electrode line 241.

The IGBT may further include a plurality of second gate structures 232 formed in the turn-off regions B. The plurality of second gate structures 232 may be electrically connected to the emission regions 250.

In one embodiment, the IGBT may be formed by the fabrication methods described above.

Therefore, according to the disclosed IGBT, the emission regions may be used to connect a low voltage level. Further, the emission region may be electrically connected with the portion of the well region formed in the turn-off regions. As a result, the portion of the well region may also be connected to the low voltage level. During the process to turn off the formed IGBT, the portion of the well region in the turn-off regions may be able to pull out holes from the drift region such that the turn-off speed of the formed IGBT may be enhanced and the turn-off energy consumption may be reduced.

Further, the plurality of emission regions may be connected to the well region of the turn-off regions through a metal structure. A Schottky barrier may be formed at the contact interface between the metal structure 251 and the portion of the well region 220 in the turn-off regions B. When the first doping ions in the well region are P-type ions and the metal structure is connected to a low voltage level, electrons in the metal-gate structure may be easily transferred into the well region through the Schottky barrier. During the process to turn off the IGBT, the metal structure may be connected to a low voltage level, and the junction formed by the well region and the metal structure may be in a forward conduction state. Therefore, the electrons in the metal structure may easily enter the well region, and thus recombine with the holes in the drift region. As such, the turn-off speed of the formed IGBT may be enhanced, and the turn-off energy consumption may also be reduced.

Further, the turn-off regions may include a plurality of second gate structures. The plurality of second gate structures may be electrically connected with the plurality of emission regions. Because the emission region may be used to connect to a low voltage level, the plurality of second gate structures may also be connected to the low voltage level. During the process to turn off the IGBT, the second gate structures may be able to pull out the holes in the drift region such that the turn-off speed of the IGBT may be enhanced and the turn-off energy consumption of the IGBT may also be reduced.

Further, forming the plurality of first gate structures and the plurality of second gate structures in the well region and the drift region may be able to allow the channels to be formed on the sidewall surfaces of the first gate structures such that the channels may extend along the direction perpendicular to the surface of the substrate. As such, the integration level of the formed IGBT may be improved. In addition, the ability of the first gate structures and the second gate structure to control the charge carriers may also be improved.

Further, forming the second gate structures in the well region and the drift region may be able to increase the contact area between each second gate structure and the well region as well as the drift region. As such, the ability of the second gate structures to pull out holes may be improved, and thus the turn-off energy consumption may be reduced.

Compared to existing fabrication methods and IGBTs, the disclosed fabrication methods and IGBT may demonstrate several advantages.

According to the disclosed IGBT, the emission regions may be used to connect a low voltage level, and the emission region may be electrically connected to the portion of the well region formed in the turn-off regions. Therefore, the portion of the well region may also be connected to the low voltage level. During the process to turn off the formed IGBT, the portion of the well region in the turn-off regions may be able to pull out holes from the drift region such that the turn-off speed of the formed IGBT may be enhanced and the turn-off energy consumption may be reduced.

Further, the plurality of emission regions may be connected to the well region of the turn-off regions through a metal structure. A Schottky barrier may be formed at the contact interface between the metal structure and the portion of the well region in the turn-off regions. When the first doping ions in the well region are P-type ions and the metal structure is connected to a low voltage level, electrons in the metal-gate structure may be easily transferred into the well region through the Schottky barrier. During the process to turn off the IGBT, the metal structure may be connected to a low voltage level, and the junction formed by the well region and the metal structure may be in a forward conduction state. Therefore, the electrons in the metal structure may easily enter the well region, and thus recombine with the holes in the drift region. As such, the turn-off speed of the formed IGBT may be enhanced, and the turn-off energy consumption may also be reduced.

Further, the turn-off regions may include a plurality of second gate structures. The plurality of second gate structures may be electrically connected with the plurality of emission regions. Because the emission region may be used to connect to a low voltage level, the plurality of second gate structures may also be connected to the low voltage level. During the process to turn off the IGBT, the second gate structures may be able to pull out the holes in the drift region such that the turn-off speed of the IGBT may be enhanced and the turn-off energy consumption of the IGBT may also be reduced.

Further, forming the plurality of first gate structures and the plurality of second gate structures in the well region and the drift region may be able to allow the channels to be formed on the sidewall surfaces of the first gate structures such that the channels may extend along the direction perpendicular to the surface of the substrate. As such, the integration level of the formed IGBT may be improved. In addition, the ability of the first gate structures and the second gate structure to control the charge carriers may also be improved.

Further, forming the second gate structures in the well region and the drift region may be able to increase the contact area between each second gate structure and the well region as well as the drift region. As such, the ability of the second gate structures to pull out holes may be improved, and thus the turn-off energy consumption may be reduced.

Therefore, according to the disclosed methods for fabricating IGBTs, the emission regions may be used to connect a low voltage level, and the emission region may be electrically connected to the portion of the well region formed in the turn-off regions. Therefore, the portion of the well region may also be connected to the low voltage level. During the process to turn off the formed IGBT, the portion of the well region in the turn-off regions may be able to pull out holes from the drift region such that the turn-off speed of the formed IGBT may be enhanced and the turn-off energy consumption may be reduced.

Moreover, according to the disclosed methods for fabricating IGBTs, the formation of the collection region may not require performing a photolithography process prior to implanting the first doping ions into the substrate from the side opposite to the well region. As such, the fabrication process may be simplified.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an insulated gate bipolar transistor (IGBT), comprising:
    providing a substrate including a device region, wherein:
        the device region includes a plurality of control regions and a plurality of turn-off regions, arranged alternately along a direction parallel to a surface of the substrate, and
        a drift region is formed in the substrate of the plurality of control regions and the plurality of turn-off regions;
    forming a well region in a portion of the substrate in the control regions and the turn-off regions, and a plurality of first gate structures in the control regions, wherein the well region is in contact with the drift region, and the plurality of first gate structures are in contact with both the drift region and the well region; and
    forming a plurality of emission regions in the well region of the control regions, wherein the plurality of emission regions are formed in the substrate on one side or both sides of each first gate structure, the drift region and each emission region are separated by the well region, each plurality of emission regions is in contact with a corresponding first gate structure and isolated from an adjacent first gate structure by the well region, and the plurality of emission regions are electrically connected to a portion of the well region in the turn-off region.

2. The method according to claim 1, further including:
forming a collection region in the substrate, wherein the collection region and the device region are arranged into a bilayer structure along a direction perpendicular to the surface of the substrate, and the collection region is in contact with the drift region.

3. The method according to claim 1, further including:
forming a plurality of second gate structures in the turn-off regions, wherein the plurality of second gate structures are electrically connected to the emission regions.

4. The method according to claim 3, wherein:
the substrate also includes a connection region, wherein the connection region and the device region are arranged side by side along a direction parallel to the surface of the substrate, and each first gate structure extends into the connection region; and
forming the plurality of first gate structures and the plurality of second gate structures includes:
etching the drift region and the well region to form a plurality of first trenches in a portion of the substrate in the control regions and also in the connection region and form a plurality of second trenches in a portion of the substrate in the turn-off regions;
forming a first gate structure in each first trench; and
forming a second gate structure in each second trench.

5. The method according to claim 4, further including:
forming a gate electrode connection structure in the connection region to connect the plurality of first gate structures.

6. The method according to claim 5, wherein the gate electrode connection structure includes:
a gate electrode line connecting to the plurality of first gate structures in the connection region; and
a gate electrode metal structure connecting to the gate electrode line.

7. A method for fabricating an insulated gate bipolar transistor IGBT), comprising:
providing a substrate including a device region, wherein:
the device region includes a plurality of control regions and a plurality of turn-off regions, arranged alternately along a direction parallel to a surface of the substrate, and
a drift region is formed in the substrate of the plurality of control regions and the plurality of turn-off regions;
forming a well region in a portion of the substrate in the control regions and the turn-off regions, and a plurality of first gate structures in the control regions, wherein the well region is in contact with the drift region, and the plurality of first gate structures are in contact with both the drift region and the well region; and
forming a plurality of emission regions in the well region of the control regions, wherein the emission regions are formed in the substrate on one side or both sides of each first gate structure, the drift region and each emission region are separated by the well region, and the emission regions are electrically connected to a portion of the well region in the turn-off region;
forming a metal structure on surfaces of the well region and the emission regions in the turn-off regions.

8. The method according to claim 7, wherein forming the metal structure further includes:
forming a dielectric layer to cover the plurality of first gate structures in the control regions, wherein the dielectric layer exposes the well region in the turn-off regions and also exposes the emission regions in the turn-off regions;
forming a metal structure on the dielectric layer in the control regions, a surface of the emission regions, and a surface of the well region in the turn-off regions.

9. The method according to claim 7, wherein:
the metal structure is made of copper or aluminum.

10. A method for fabricating an insulated gate bipolar transistor IGBT), comprising:
providing a substrate including a device region, wherein:
the device region includes a plurality of control regions and a plurality of turn-off regions, arranged alternately along a direction parallel to a surface of the substrate, and
a drift region is formed in the substrate of the plurality of control regions and the plurality of turn-off regions;
forming a well region in a portion of the substrate in the control regions and the turn-off regions, and a plurality of first gate structures in the control regions, wherein the well region is in contact with the drift region, and the plurality of first gate structures are in contact with both the drift region and the well region; and
forming a plurality of emission regions in the well region of the control regions, wherein the emission regions are formed in the substrate on one side or both sides of each first gate structure, the drift region and each emission region are separated by the well region, and the emission regions are electrically connected to a portion of the well region in the turn-off region, wherein:
each first gate structure has one corresponding emission region only on one side of each first gate structure.

11. The method according to claim 2, wherein:
the emission regions and the drift region contain first doping ions; and
the well region and the collection region contain second doping ions, wherein:
the first doping ions are N-type ions and the second doping ions are P-type ions.

12. The method according to claim 2, wherein:
the drift region and the well region are arranged into a bilayer structure along the direction perpendicular to the surface of the substrate;
the drift region is formed between the well region and the collection region; and
each first gate structure is formed through the well region of the control regions along the direction perpendicular to the surface of the substrate and extends into the drift region of the control regions.

13. The method according to claim 7, further including:
forming a collection region in the substrate, wherein the collection region and the device region are arranged into a bilayer structure along a direction perpendicular to the surface of the substrate, and the collection region is in contact with the drift region.

14. The method according to claim 7, further including:
forming a plurality of second gate structures in the turn-off regions, wherein the plurality of second gate structures are electrically connected to the emission regions.

15. The method according to claim 14, wherein:
the substrate also includes a connection region, wherein the connection region and the device region are arranged side by side along a direction parallel to the surface of the substrate, and each first gate structure extends into the connection region; and forming the plurality of first gate structures and the plurality of second gate structures includes:
etching the drift region and the well region to form a plurality of first trenches in a portion of the substrate in the control regions and also in the connection region and form a plurality of second trenches in a portion of the substrate in the turn-off regions;
forming a first gate structure in each first trench; and
forming a second gate structure in each second trench.

16. The method according to claim 14, further including:
forming a gate electrode connection structure in the connection region to connect the plurality of first gate structures.

17. The method according to claim 16, wherein the gate electrode connection structure includes:
a gate electrode line connecting to the plurality of first gate structures in the connection region; and
a gate electrode metal structure connecting to the gate electrode line.

18. The method according to claim 13, wherein:
the emission regions and the drift region contain first doping ions; and
the well region and the collection region contain second doping ions, wherein:
the first doping ions are N-type ions and the second doping ions are P-type ions.

19. The method according to claim 13, wherein:
the drift region and the well region are arranged into a bilayer structure along the direction perpendicular to the surface of the substrate;
the drift region is formed between the well region and the collection region; and
each first gate structure is formed through the well region of the control regions along the direction perpendicular to the surface of the substrate and extends into the drift region of the control regions.

20. The method according to claim 10, further including:
forming a collection region in the substrate, wherein the collection region and the device region are arranged into a bilayer structure along a direction perpendicular to the surface of the substrate, and the collection region is in contact with the drift region.

* * * * *